(12) United States Patent
Ahn et al.

(10) Patent No.: US 9,087,803 B2
(45) Date of Patent: Jul. 21, 2015

(54) METHODS OF TESTING INTEGRATED CIRCUIT DEVICES USING FUSE ELEMENTS

(75) Inventors: Jeong-Hoon Ahn, Yongin-si (KR); Hyun-Min Choi, Anyang-si (KR); Oluwafemi O. Ogunsola, South Hopewell Junction, NY (US)

(73) Assignees: Samsung Electronics Co., Ltd. (KR); International Business Machines Corporation, Armonk, NY (US)

( * ) Notice: Subject to any disclaimer, the term of this patent is extended or adjusted under 35 U.S.C. 154(b) by 755 days.

(21) Appl. No.: 13/300,274

(22) Filed: Nov. 18, 2011

(65) Prior Publication Data

US 2013/0130415 A1     May 23, 2013

(51) Int. Cl.
*H01L 21/66* (2006.01)
*H01L 23/525* (2006.01)

(52) U.S. Cl.
CPC .............. *H01L 22/34* (2013.01); *H01L 22/14* (2013.01); *H01L 22/20* (2013.01); *H01L 23/5256* (2013.01); *H01L 2924/0002* (2013.01)

(58) Field of Classification Search
CPC .............................. H01L 22/14; H01L 22/34
USPC ...................................... 438/18; 257/E21.531
See application file for complete search history.

(56) References Cited

U.S. PATENT DOCUMENTS

2006/0163571 A1 *  7/2006  Lim et al. ................. 257/48

FOREIGN PATENT DOCUMENTS

| JP | 11-330170 | 11/1999 |
| JP | 2008-016707 | 1/2008 |
| KR | 1020030085182 A | 11/2003 |
| KR | 20130055504 A * | 5/2013 |

* cited by examiner

*Primary Examiner* — Bac Au
*Assistant Examiner* — Toniae Thomas
(74) *Attorney, Agent, or Firm* — Myers Bigel Sibley & Sajovec, PA

(57) ABSTRACT

Methods of fabricating integrated circuit devices utilize fuse elements to support sequential testing of vertically-integrated test elements during fabrication. These methods include forming a first test element, a first fuse and a first test pad electrically connected by the first fuse to the first test element, on a substrate. The first test element is tested by passing a first current between the first test element and first test pad and through the first fuse. The first fuse is then "cut" by increasing an impedance of the first fuse, which may include breaking the first fuse to create an electrical "open" (infinite impedance) or greatly increasing a resistance of the first fuse (e.g., by narrowing the fuse through electromigration). A second test element and a second test pad, which is electrically connected to the second test element and the first test pad, are then formed on the substrate.

19 Claims, 13 Drawing Sheets

METHODS OF TESTING INTEGRATED CIRCUIT DEVICES USING FUSE ELEMENTS

FIELD OF THE INVENTION

The present invention relates to a test method for a semiconductor device and, more particularly to a test method for a semiconductor device using a fuse.

BACKGROUND

In general, a semiconductor device formed on a semiconductor substrate made of, for example, silicon, is formed through a series of unit processes, including a film stacking process, impurity doping process, a photolithography process for patterning films, and an etching process. In order to determine whether each unit process has accurately been performed to be adapted to the design, failures of manufactured semiconductor devices, including transistors, capacitors, resistors, inductors, and so on, are detected or parameter characteristics thereof are evaluated whenever the unit process is completed.

As described above, in order to evaluate electrical properties of semiconductor devices, test elements are formed together with the semiconductor devices. The test elements are generally formed on scribe line regions existing between adjacent integrated circuit chips on a semiconductor substrate.

A test element is electrically connected to a pad. In order to test a test element, a probe terminal is brought into contact with the pad to apply a predetermined signal to the test element. Then, the signal output through the pad is analyzed to evaluate the electrical properties of semiconductor devices.

However, the respective pads, excluding those pads for grounding, are electrically connected to one test element, to then be used to test one test element. Therefore, as the number of test elements to be tested increases, the number of pads increases. However, since a space of a semiconductor device in which pads are to be formed is restricted, there exists a need for a method of more efficiently testing a test element using a restricted number of pads.

SUMMARY

Methods of fabricating integrated circuit devices utilize fuse elements to support sequential testing of vertically-integrated test elements during fabrication. According to some embodiments of the invention, a method of fabricating an integrated circuit device can include forming a first test element, a first fuse and a first test pad electrically connected by the first fuse to the first test element, on a substrate. The first test element is then tested by passing a first current between the first test element and first test pad and through the first fuse. After testing of the first test element is completed, the first fuse is "cut" by increasing an impedance of the first fuse, which may include breaking the first fuse to create an electrical "open" (infinite impedance) or greatly increasing a resistance of the first fuse (e.g., by narrowing the fuse through electromigration). A second test element and a second test pad, which is electrically connected to the second test element and the first test pad, are then formed on the substrate. An operation is then performed to test the second test element by passing a second current between the second test element and the second test pad, and by using the cut first fuse to at least inhibit (or completely block) flow of current between the first test pad and the first test element.

According to additional embodiments of the invention, the first test pad extends underneath the second test pad and between the second test pad and the substrate. Similarly, the first test element may extend underneath the second test element and between the second test element and the substrate. In addition, the first fuse may have first and second ends/terminals and the cutting of the first fuse may include breaking an electrical connection between the first and second ends/terminals. In some embodiments of the invention, the first fuse is a silicide electromigration fuse.

According to still further embodiments of the invention, a method of fabricating an integrated circuit device includes forming a first test element on a substrate and then forming a first electrically insulating layer having first and second electrical interconnects therein, on the first test element. First and second test pads are formed on the first electrically insulating layer. The first and second test pads are electrically connected to the first test element by the first and second electrical interconnects, respectively. Operation of the first test element is then verified by contacting a pair of test probes to the first and second test pads and performing a test operation. A second test element is also formed on the first electrically insulating layer. This second test element is vertically aligned relative to the first test element. A second electrically insulating layer having third and fourth electrical interconnects therein is formed on the second test element. Third and fourth test pads are formed on the second electrically insulating layer. The third and fourth test pads are electrically connected to the second test element by the first and second electrical interconnects, respectively. Operation of the second test element is verified by contacting a pair of test probes to the third and fourth test pads. The first electrical interconnect may include a first fuse therein and the operation of testing the second test element may be preceded by blowing the first fuse.

According to still further embodiments of the invention, an integrated circuit device includes a first test element on a substrate and a first electrically insulating layer on the first test element. A second test element is provided on the first electrically insulating layer and is vertically aligned relative to the first test element. A second electrically insulating layer is provided on the second test element and first and second test pads are provided on the second electrically insulating layer. The first test pad is electrically connected to the first and second test elements by first and second electrical interconnects and the second test pad is electrically connected to the first and second test elements by third and fourth electrical interconnects. In addition, to facilitate efficient testing of the multiple test elements, at least one of the first through fourth electrical interconnects includes a fuse element, which can be blown to support sequential testing of the test elements.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE EMBODIMENTS

Figure 1:
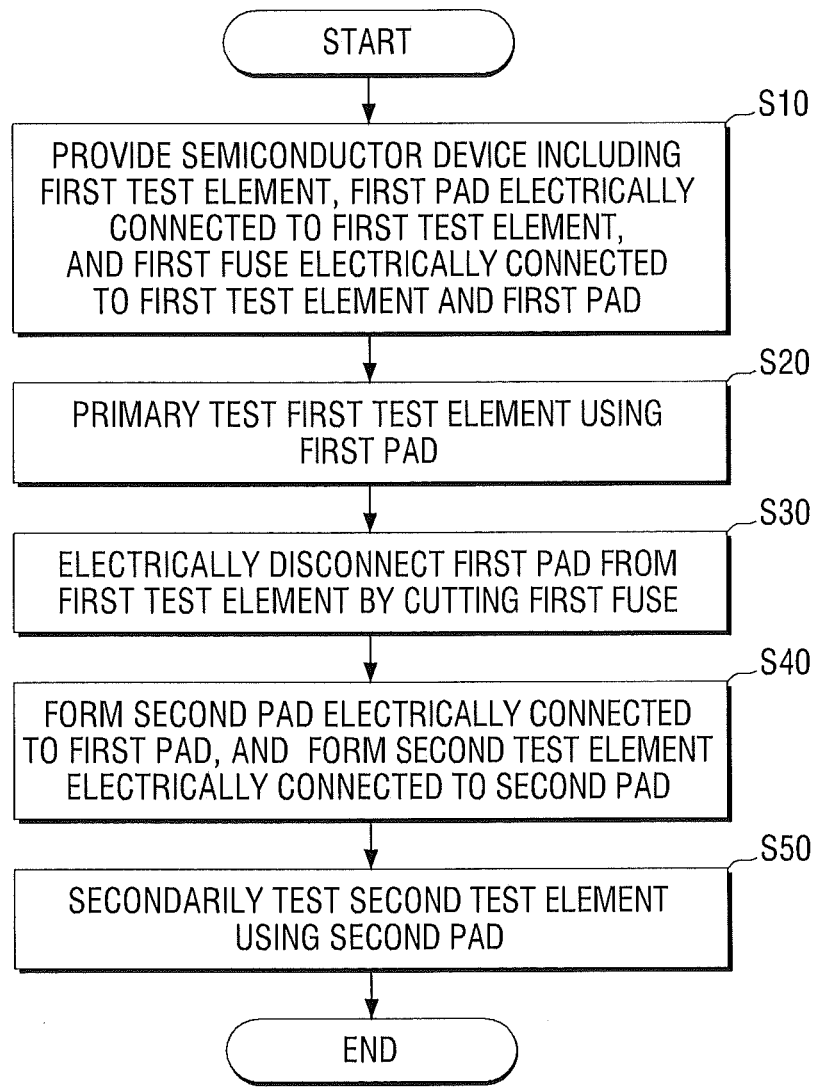
FIG. 1 is a flow chart of a test method for a semiconductor device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A test method for a semiconductor device according to an embodiment of the present invention will be described with reference to FIGS. 1 to 11. FIG. 1 is a flow chart of a test method for a semiconductor device according to an embodiment of the present invention, and FIGS. 2 to 11 are a plan view and cross-sectional views of a semiconductor device for explaining the test method for a semiconductor device according to an embodiment of the present invention.

Figure 2:
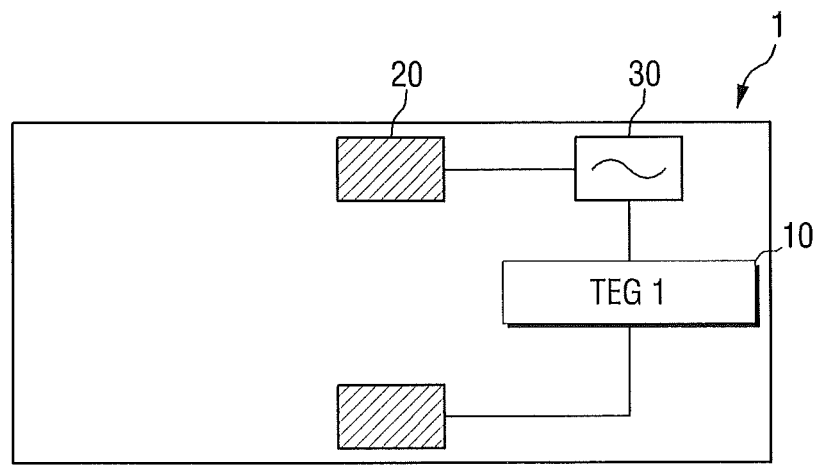
FIGS. 2 to 11 are a plan view and cross-sectional views of a semiconductor device for explaining the test method for a semiconductor device according to an embodiment of the present invention.
Figure 3:
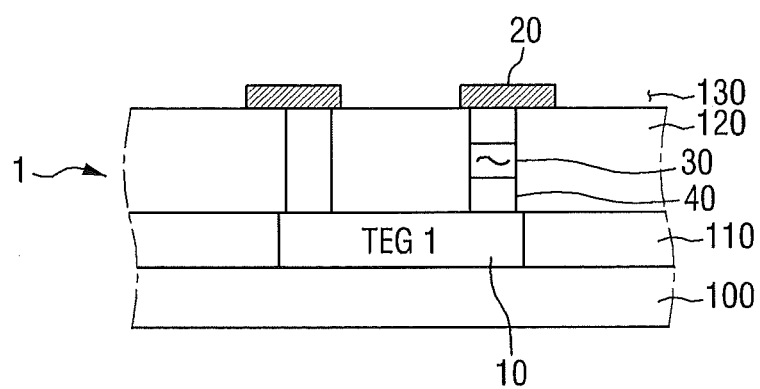

Referring first to FIGS. 1 to 3, a semiconductor device 1 is provided, the semiconductor device 1 including a first test element 10, a first pad 20 electrically connected to the first test element 10, and a first fuse 30 electrically connected to the first test element 10 and the first pad 20 (S10). The first test element 10 may be formed on a semiconductor substrate 100 and may be positioned on a first layer level 110. The first test element 10 may be a test element group (TEG). The first test element 10 may include, for example, a P channel transistor for a logic gate, an N channel transistor for a logic gate, a field N channel transistor, a field P channel transistor, a capacitor for a logic gate, a contact chain or resistor, but is not limited thereto. Throughout this specification, the term "layer level" is used to indicate relative positions of layer levels, but a layer level is not limited to a single layer. For example, a layer level may include a plurality of layers.

The first pad 20 is electrically connected to the first test element 10 via the first fuse 30. The first pad 20 and the first test element 10 may be connected to each other by, for example, a contact structure 40. A layer level at which the first pad 20 is positioned may be higher than a layer level at which the first test element 10 is positioned. For example, the first test element 10 may be positioned on a first layer level 110 and the first pad 20 may be positioned on a third layer level 130 higher than the first layer level 110.

The first fuse 30 may be electrically connected to the first test element 10 and the first pad 20. That is to say, the first test element 10 and the first pad 20 are electrically connected by the first fuse 30. Therefore, the first test element 10 and the first pad 20 may be electrically disconnected by cutting the first fuse 30. The first fuse 30 may be an electric fuse (e-fuse), for example, a silicide electromigration fuse, or a metal electromigration fuse.

In a case where the first fuse 30 is a silicide electromigration fuse, the first fuse 30 may include a silicide layer. If an excessive current flows in the first fuse 30, atoms in the silicide layer undergo electromigration, so that resistance of the first fuse 30 may increase. If the resistance of the first fuse 30 becomes high, it is difficult for a current to flow through the first fuse 30. Thus, the first test element 10 and the first pad 20 may become electrically disconnected from each other.

In a case where the first fuse 30 is a metal electromigration fuse, the first fuse 30 may include a metal layer. If an excessive current flows in the first fuse 30, atoms in the metal layer undergo electromigration, so that resistance of the first fuse 30 may increase. If the resistance of the first fuse 30 becomes high, it is difficult for a current to flow through the first fuse 30. Thus, the first test element 10 and the first pad 20 may become electrically disconnected from each other.

As described above, in a case where the first fuse 30 is an e-fuse, a current exceeding a predetermined level is allowed to pass through the first fuse 30, thereby cutting the first fuse 30. However, the present invention does not limit the type of the first fuse 30 as long as the first test element 10 and the first pad 20 can be electrically disconnected from each other by cutting the first fuse 30. For example, the first fuse 30 may be a laser fuse, and the first fuse 30 may be cut by irradiating laser into the first fuse 30.

The first fuse 30 may be formed on a via layer. The via layer level refers to a level at which the contact structure 40 is formed. Referring to FIG. 3, the via layer level may be a second layer level 120 at which the contact structure 40 is formed. For example, when the first fuse 30 is a metal electromigration fuse, the first fuse 30 may be formed on a via layer level.

Figure 13:
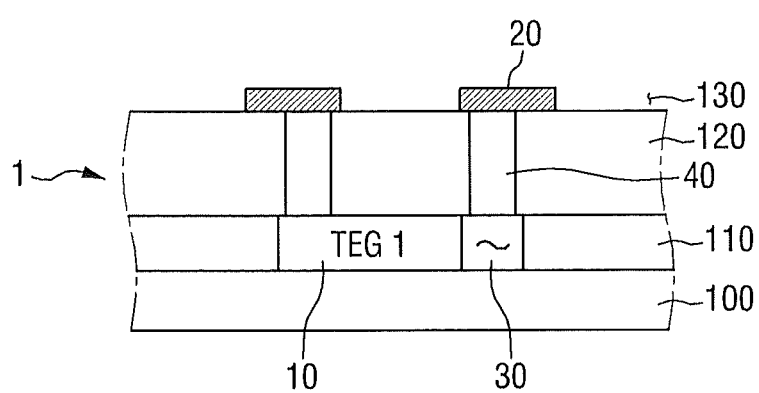
FIGS. 13 to 14 are cross-sectional views of a test method for a semiconductor device according to still another embodiment of the present invention.
Figure 14:
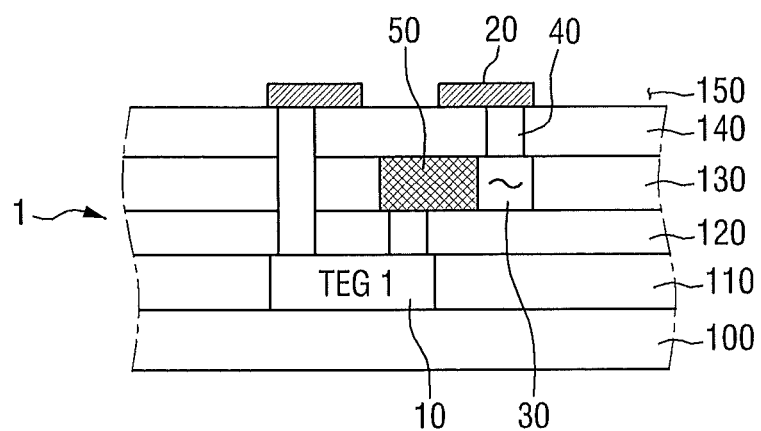

Alternatively, unlike in FIG. 3, the first fuse 30 may be formed on a different layer level, as shown in FIGS. 13 and 14. FIGS. 13 to 14 are cross-sectional views of a test method for a semiconductor device according to still another embodiment of the present invention. The first fuse 30 may be formed on an active layer or a gate layer level. Here, the active layer level refers to a level at which an active region of the semiconductor device 1 is formed, and the gate layer level refers to a level at which a gate is formed. As shown in FIG. 13, the layer level and the gate layer level may be the first layer level 110. For example, in a case where the first fuse 30 is a silicide electromigration fuse, the first fuse 30 may be formed on an active layer level or a gate layer level. In addition, the first fuse 30 may be formed on a wire layer level. The wire layer level refers to a level at which a metal for a wire 50 is provided. Referring to FIG. 14, the wire layer level may be a third layer level 130 where the wire 50 is formed. For example, in a case where the first fuse 30 is a metal electromigration fuse, the first fuse 30 may be formed on the wire layer level. For convenience of explanation, the invention will be made with regard to the first fuse 30 formed on a via layer. However, it should be appreciated that features of the present invention that follow will be applied to the first fuse 30 formed at various positions.

The first fuse 30 may be a single type, and may be constituted by a single fuse. However, the type of the first fuse 30 is not limited to the single type, but may be of an array type. The array type of fuse refers to a type in which a plurality of fuses are arrayed. In a case where the first fuse 30 is constituted by a plurality of fuses in array to then be connected to the semiconductor device 1, the first test element 10 and the first pad 20 can be electrically disconnected simply by cutting some of the plurality of fuses. Therefore, the use of the array type fuse allows the first fuse 30 to be effectively cut.

Figure 4:
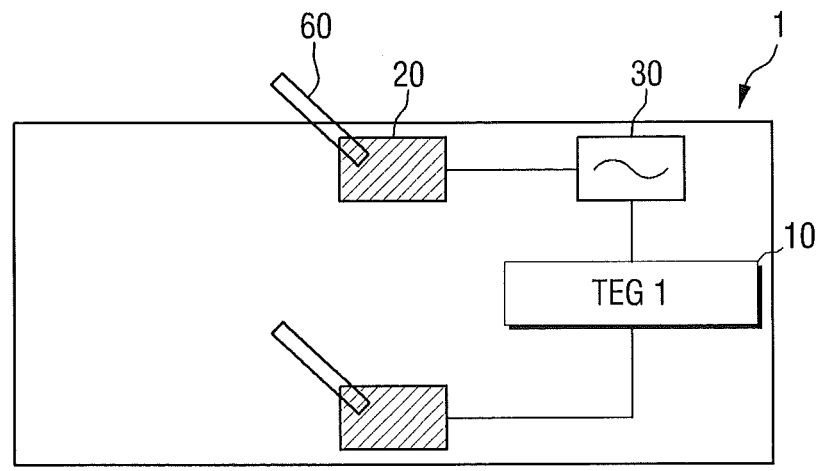
Figure 5:
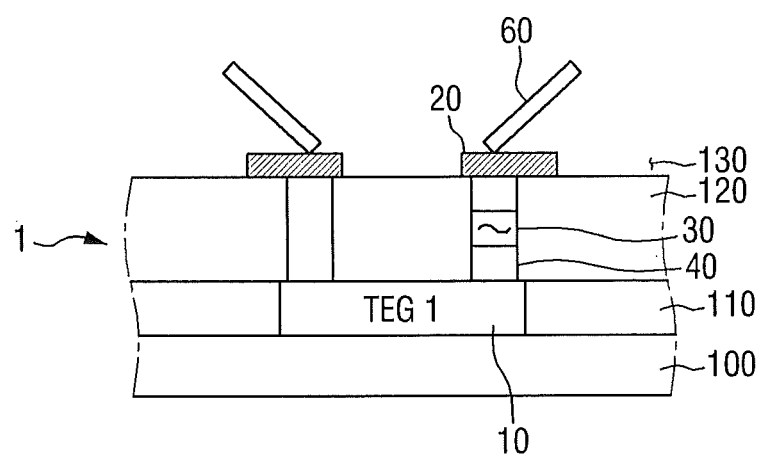

Next, the first test element 10 is primarily tested using the first pad 20 with reference to FIGS. 1, 4 and 5 (S20). A predetermined signal may be input to the first test element 10 or an output signal output from the first test element 10 may be detected by allowing a probe terminal 60 to contact the first pad 20, first test element 10. For example, a failure of the first test element 10 may be detected or parameter characteristics may be tested by analyzing the output signal output from the first test element 10, via the first pad 20. The primarily testing may be performed on, for example, the third layer level 130, using the first pad 20.

Figure 6:
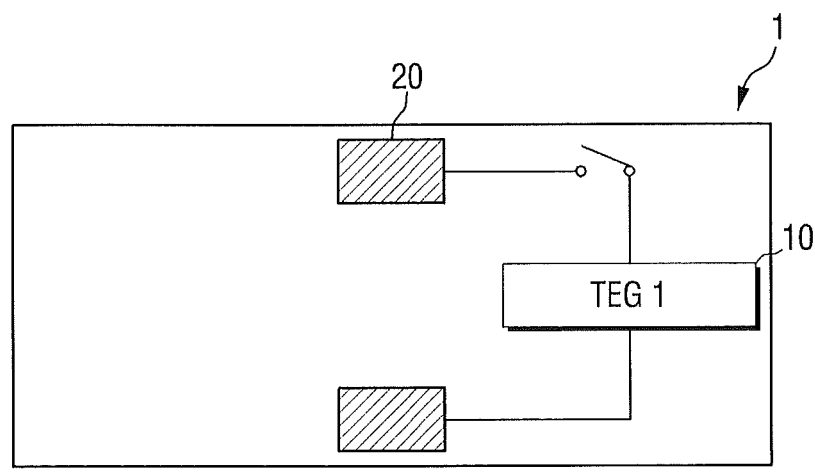
Figure 7:
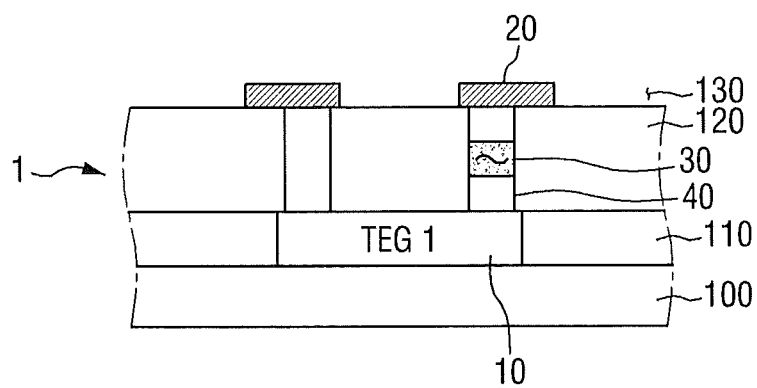

Next, referring to FIGS. 1, 6 and 7, the first pad 20 and the first test element 10 are electrically disconnected by cutting the first fuse 30 (S30). The first fuse 30 is cut in different methods according to the type of the first fuse 30. For example, if the first fuse 30 is an electric fuse, the first fuse 30 may be cut by allowing current of a predetermined level or higher to flow in the first fuse 30. If the first fuse 30 is cut, the first pad 20 and the first test element 10 become electrically disconnected.

In the embodiment illustrated in FIG. 6, a circuit is opened by cutting the first fuse 30. However, FIG. 6 shows by way of example that cutting of the first fuse 30 exerts the same effect as opening the circuit. That is to say, the first fuse 30 is physically not disconnected. For example, in a case where the first fuse 30 is an e-fuse, even if the first fuse 30 is cut, it is not physically broken but becomes in a state of high resistance.

Figure 8:
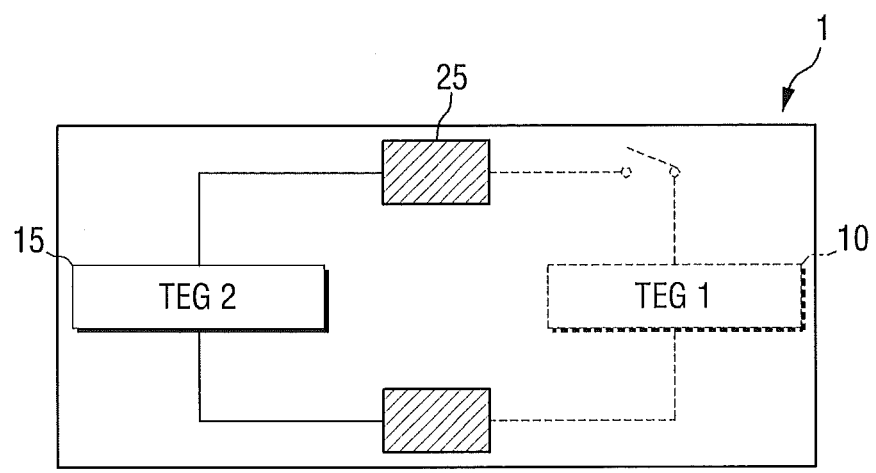
Figure 9:
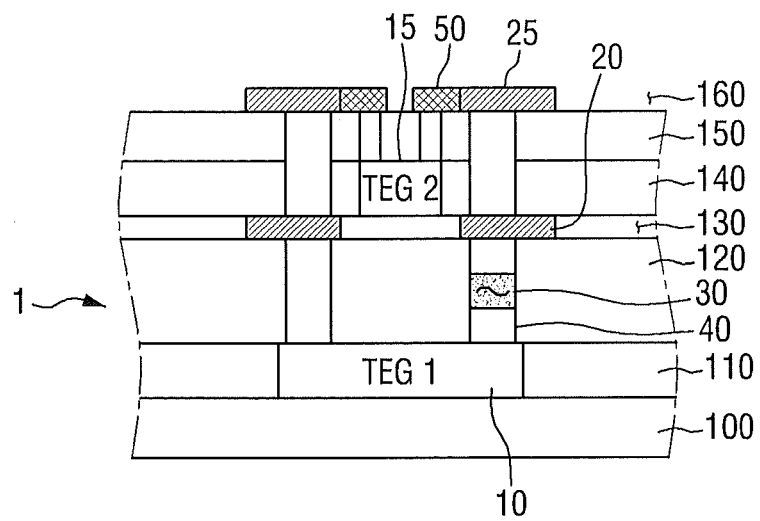

Next, referring to FIGS. 1, 8 and 9, a second pad 25 electrically connected to the first pad 20 and a second test element 15 electrically connected to the second pad 25 are formed (S40). The first pad 20 and the second pad 25 may be positioned on different layer levels. The layer level on which the second pad 25 is positioned may be higher than the layer level on which the first pad 20 is positioned. For example, the first pad 20 may be positioned on the third layer level 130, and the second pad 25 may be positioned on a sixth layer level 160 higher than the third layer level 130.

The second pad 25 may be electrically connected to the first pad 20 through, for example, the contact structure 40. The first pad 20 and the second pad 25, which are electrically connected, constitute a single pad set. The second pad 25 may be formed to overlap with the first pad 20. The first pad 20 and the second pad 25 are positioned on different layer levels and overlap with each other. Therefore, only the second pad 25 positioned on a relatively high layer level is illustrated in FIG. 9. The second test element 15 is electrically connected to the second pad 25. The second pad 25 and the second test element 15 may be connected to each other through the contact structure 40 and the wire 50.

The layer level on which the second test element 15 is positioned may be higher than the layer level on which the first test element 10 is positioned. For example, the first test element 10 may be positioned on the first layer level 110 and the second test element 15 may be positioned on the fourth layer level 140 higher than the first layer level 110. The layer level on which the second test element 15 is positioned may be higher than the layer level on which the first pad 20 is positioned. The second test element 15 is formed after the first test element 10 is tested using the first pad 20. Therefore, since the second test element 15 may be formed after the first pad 20 is formed, the second test element 15 may be positioned on a higher layer level than the first pad 20.

Figure 10:
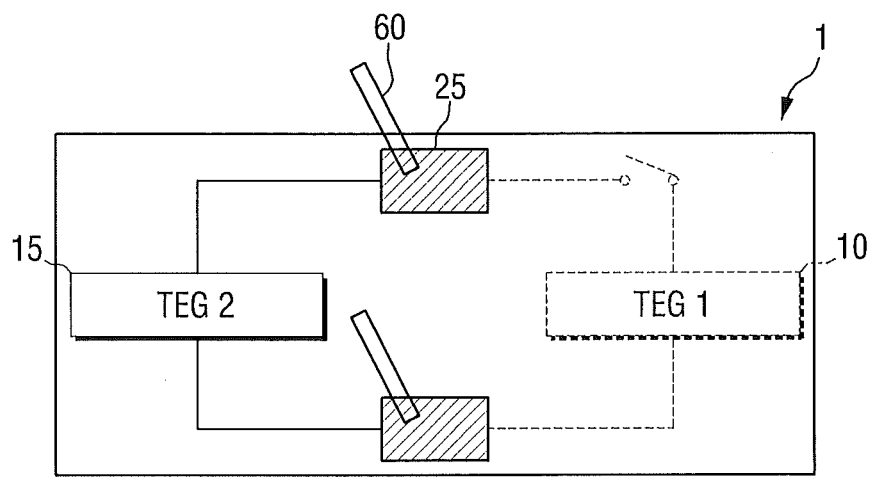
Figure 11:
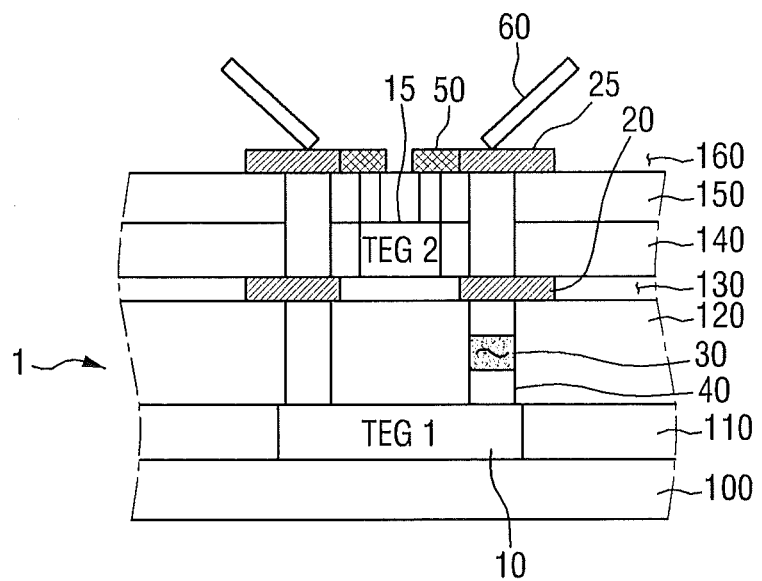

Next, referring to FIGS. 1, 10 and 11, the second test element 15 is secondarily tested using the second pad 25 (S50). The secondarily testing of the second test element 15 is performed in a similar manner to the primarily testing of the first test element 10. However, the secondarily testing may be performed on a different layer level from a layer level on which the primarily testing is performed using the second pad 25. The secondarily testing may be performed on, for example, a sixth layer level 160.

Figure 12:
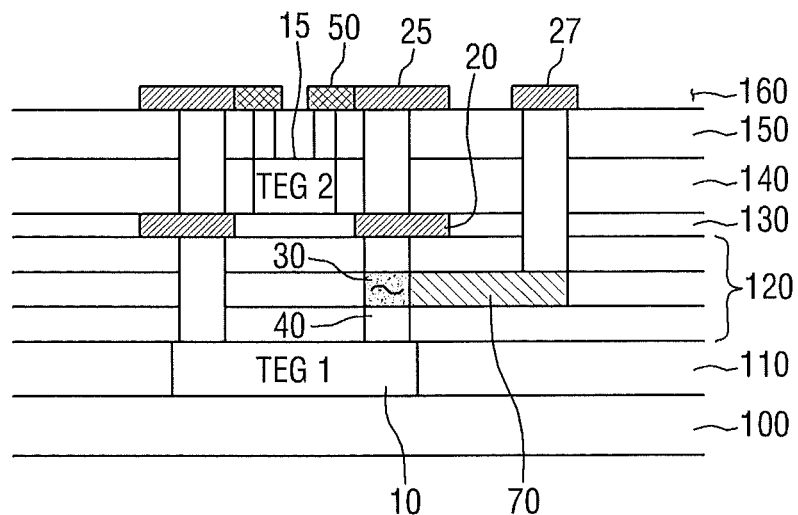
FIG. 12 is a cross-sectional view of a semiconductor device according to another embodiment of the present invention.

A current leakage measuring device 70 for compensating for the secondarily testing will now be described with reference to FIG. 12. FIG. 12 is a cross-sectional view of a semiconductor device according to another embodiment of the present invention. In a case where the first fuse 30 is an e-fuse, as described above, even if the first fuse 30 is cut by allowing a current of a predetermined level or higher to flow through the first fuse 30, the first fuse 30 may not be completely electrically cut. Therefore, since some small current may flow through the first fuse 30 cut during the secondarily testing of the second test element 15, there is a risk of generating an error in the secondarily testing. Therefore, the semiconductor device 1 according to the embodiment of the present invention may further include the current leakage measuring device 70. Before performing the secondarily testing, the level of current leaking through the cut first fuse 30 may be measured using the current leakage measuring device 70. For example, the level of leakage current may be measured using a third pad 27 connected to the current leakage measuring device 70.

Data on the level of leakage current measured by the current leakage measuring device 70 is used in the measured secondarily testing, thereby reducing an error in the secondarily testing.

After the testing of the semiconductor device 1 according to the embodiment using the above-described test method is completed, the semiconductor device 1 has the following configuration. The semiconductor device 1 includes the first test element 10, the second test element 15, the first pad 20 connected to the first test element 10, the first fuse 30 cut and electrically connected to the first test element 10 and the first pad 20, and the second pad 25 electrically connected to the second test element 15 and the first pad 20. Since the first fuse 30 is cut after testing the first test element 10, the semiconductor device 1 includes the cut first fuse 30.

In the test method for the semiconductor device according to the embodiment of the present invention, a plurality of test elements are tested at different layer levels using a pad set composed of a plurality of pads electrically connected to each other, and fuses connected between the pad set and the test elements. That is to say, a first test element is tested at a given layer level using the pad set and the fuse therebetween is cut, thereby electrically disconnecting the first test element from the pad set. Next, a second test element may be tested at another layer level using the pad set. That is to say, since a plurality of test elements are tested using one pad set, a limited space of a semiconductor device can be efficiently utilized.

Figure 15:
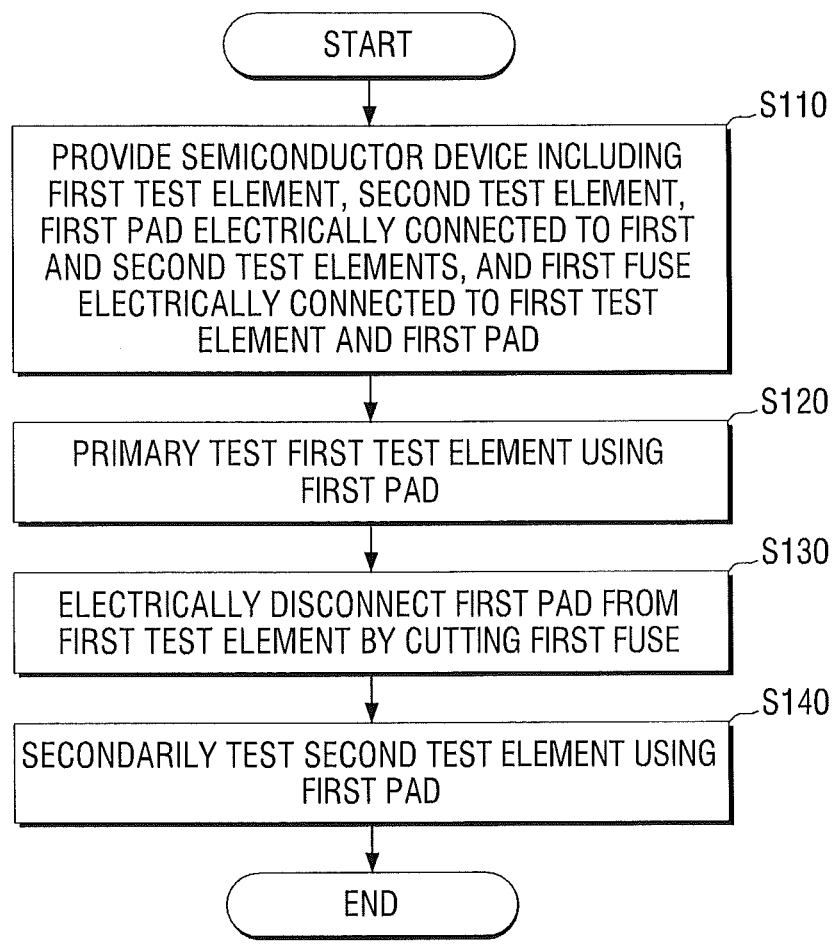
FIG. 15 is a flow chart of a test method for a semiconductor device according to still another embodiment of the present invention.
Figure 16:
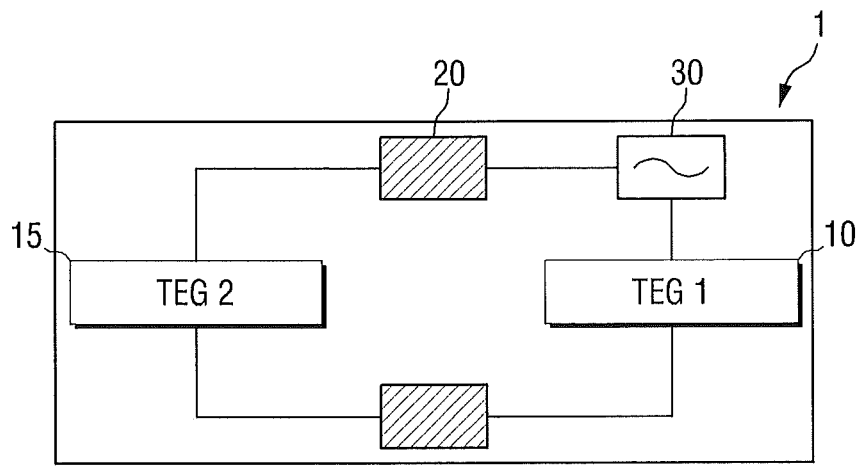
FIGS. 16 to 19 are a plan view and cross-sectional views of a semiconductor device for explaining the test method for a semiconductor device according to still another embodiment of the present invention.
Figure 17:
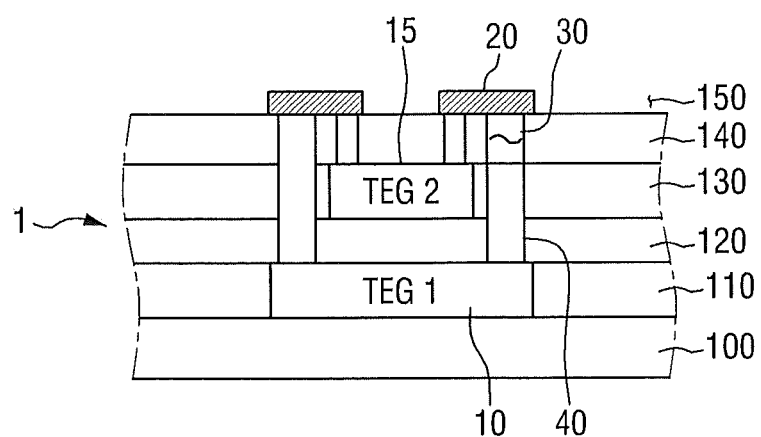

A test method for a semiconductor device according to another embodiment of the present invention will be described with reference to FIGS. 15 to 19. However, the following description will focus on differences between the test methods for semiconductor devices according to the current embodiment and previous embodiment. FIG. 15 is a flow chart of a test method for a semiconductor device according to still another embodiment of the present invention and FIGS. 16 to 19 are a plan view and cross-sectional views of a semiconductor device for explaining the test method for a semiconductor device according to still another embodiment of the present invention. Referring first to FIGS. 15 to 17, a semiconductor device 1 is provided, the semiconductor device 1 including a first test element 10, a second test element 15, a first pad 20 electrically connected to the first test element 10 and the second test element 15, and a first fuse 30 electrically connected to the first test element 10 and the first pad 20 (S110).

The first test element 10 may be positioned on a first layer level 110 and the second test element 15 may be positioned on a third layer level 130. However, there is no limitation in the layer levels at which the first test element 10 and the second test element 15 are positioned. The first pad 20 is electrically connected to the first test element 10 and the second test element 15. The first pad 20 may be connected to the first test element 10 and the second test element 15 through, for example, the contact structure 40. The first fuse 30 may be electrically connected to the first test element 10 and the first pad 20. That is to say, the first pad 20 and the first test element 10 are electrically connected through the first fuse 30. Next, the first test element 10 is primarily tested using the first pad 20 with reference to FIGS. 15 to 17 (S120). The test method for the first test element 10 is the same as described above.

Figure 18:
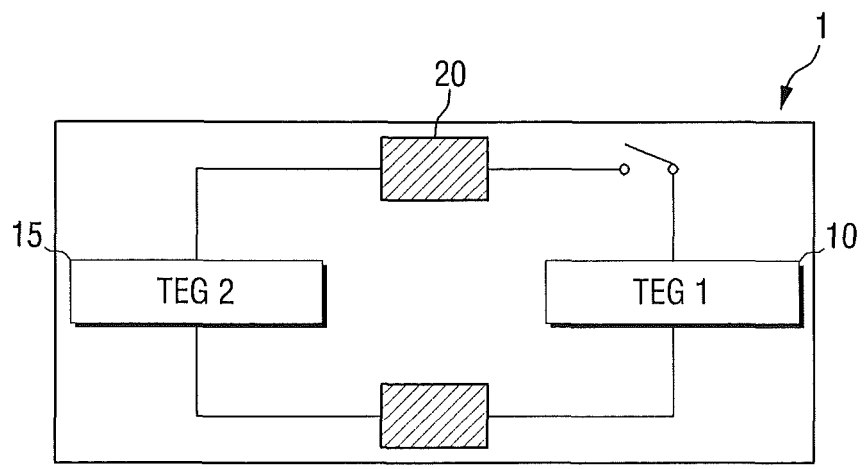
Figure 19:
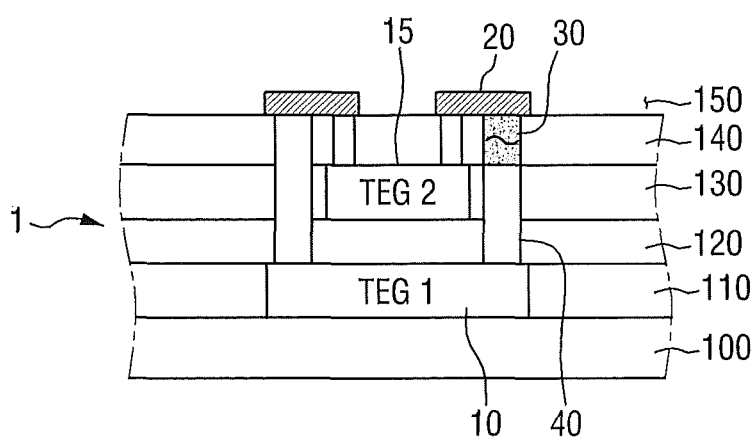

Next, referring to FIGS. 15, 18 and 19, the first pad 20 and the first test element 10 are electrically disconnected by cutting the first fuse 30 (S130). The cutting method of the first fuse 30 is the same as described above. Next, the second test element 15 is secondarily tested using the first pad 20 (S140). The test method for the second test element 15 is the same as described above. Here, the primarily testing and the secondarily testing may be performed at the same layer level. For example, the first pad 20 may be positioned on a fifth layer level 150 and the primarily testing and the secondarily testing may be both performed on the fifth layer level 150.

After the testing of the semiconductor device 1 according to the embodiment using the above-described test method is completed, the semiconductor device 1 has the following configuration. The semiconductor device 1 includes the first test element 10, the second test element 15, the first pad 20 connected to the first test element 10 and electrically connected to the second test element 15, and the first fuse 30 cut and electrically connected to the first test element 10 and the first pad 20. Since the first fuse 30 is cut after testing the first test element 10, the semiconductor device 1 includes the cut first fuse 30.

In the test method for the semiconductor device according to the embodiment of the present invention, a plurality of test elements are tested at different layer levels using a single pad, and a fuse connected between the pad and the test elements. That is to say, a first test element is tested at a given layer level using the pad and the fuse therebetween is cut, thereby electrically disconnecting the first test element from the pad. Next, a second test element may be tested at the same layer level using the same pad. That is to say, since a plurality of test elements can be tested using a single pad, a limited space of a semiconductor device can be efficiently utilized.

Figure 20:
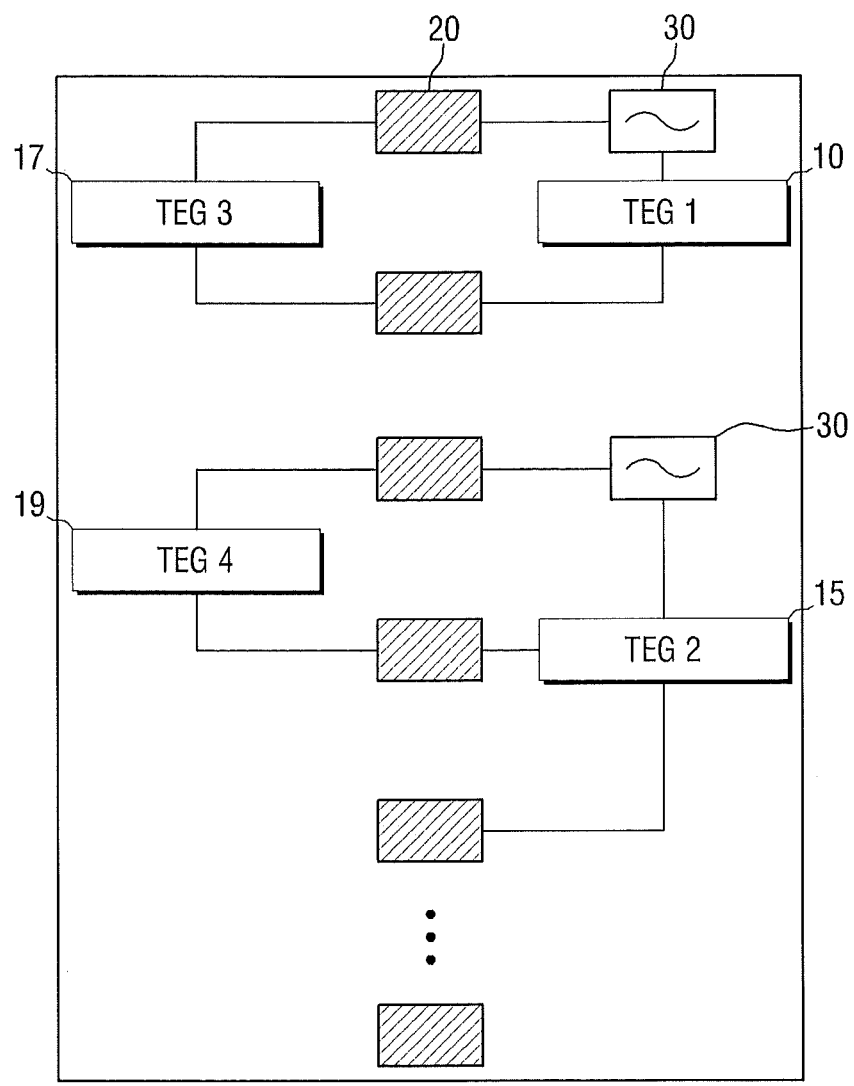
FIG. 20 is a plan view of a semiconductor device for explaining the test method for a semiconductor device according to still another embodiment of the present invention.

Next, a wide application of a test method for a semiconductor device will be described with reference to FIG. 20. FIG. 20 is a plan view of a semiconductor device for explaining the test method for a semiconductor device according to still another embodiment of the present invention. First, an application example of the test method for a semiconductor device according to the embodiment shown in FIG. 1 will now be described. The first test element 10 and the second test element 15 are primarily tested at the first layer level using a plurality of pad sets. Next, the first fuse 30 connected to the first test element 10 and the second test element 15 is cut. Thus, the first test element 10 and the second test element 15 are electrically disconnected from the pad sets to then test third test element 17 and the fourth test element 19. Finally, the third test element 17 and the fourth test element 19 are secondarily tested at the second layer level higher than the first layer level using the plurality of pad sets. Next, an application example of the test method for a semiconductor device according to the embodiment shown in FIG. 15 will now be described. The first test element 10 and the second test element 15 are primarily tested at the first layer level using a plurality of pads. Next, the first fuse 30 connected to the first test element 10 and the second test element 15 is cut. Thus, the first test element 10 and the second test element 15 are electrically disconnected from the pads to then test the third test element 17 and the fourth test element 19. Finally, the third test element 17 and the fourth test element 19 are secondarily tested at the second layer level higher than the first layer level using the plurality of pads.

Figure 21:
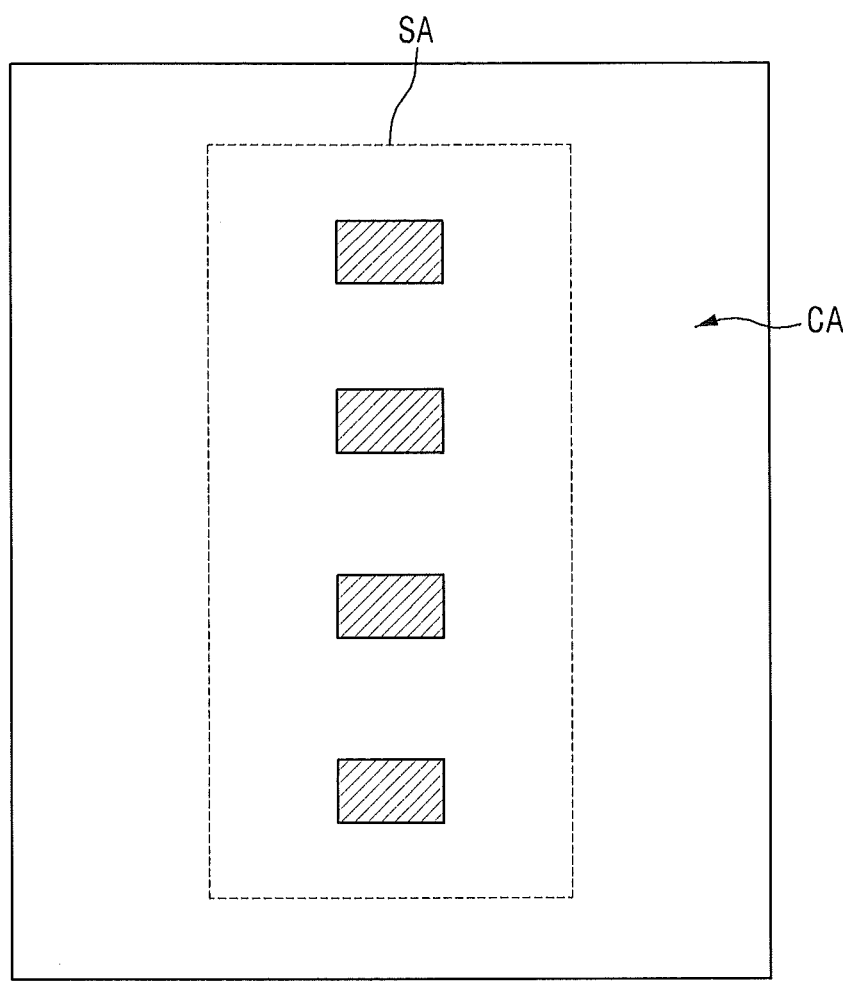
FIG. 21 is a plan view schematically illustrating a test module formed on a scribe line area.

A position of a test module on a semiconductor substrate 100 where test elements and pads are formed will be described. FIG. 21 is a plan view schematically illustrating a test module formed on a scribe line area. The test module may include test elements and pads. The test module may be disposed on a scribe line area SA of the semiconductor substrate 100. However, the present invention does not limit the position of the test module on the semiconductor substrate 100, but the test module may be disposed on a chip area CA on the semiconductor substrate 100.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method of fabricating an integrated circuit device, comprising:
   forming a first test element, a first fuse and a first test pad electrically connected by the first fuse to the first test element, on a substrate;
   testing operation of the first test element by passing a first current between the first test element and first test pad and through the first fuse;
   cutting the first fuse by increasing an impedance therein;
   forming a second test element and a second test pad electrically connected to the second test element and the first test pad, on the substrate; and
   testing operation of the second test element by passing a second current between the second test element and the second test pad, using the cut first fuse to at least inhibit flow of current between the first test pad and the first test element.

2. The method of claim 1, wherein the first test pad extends between the second test pad and the substrate.

3. The method of claim 2, wherein the first test element extends between the second test element and the substrate.

4. The method of claim 1, wherein the first fuse has first and second terminals; and wherein said cutting the first fuse comprises breaking an electrical connection between the first and second terminals.

5. The method of claim 2, wherein the first and second test pads are vertically aligned relative to each other.

6. The method of claim 1, wherein the first fuse is a silicide electromigration fuse.

7. A method of fabricating an integrated circuit device, comprising:
   forming a first test element on a substrate;
   forming a first electrically insulating layer having first and second electrical interconnects therein, on the first test element;
   forming first and second test pads on the first electrically insulating layer, said first and second test pads electrically connected to the first test element by the first and second electrical interconnects, respectively;
   testing operation of the first test element by contacting a pair of test probes to the first and second test pads;
   forming a second test element that is vertically aligned relative to the first test element, on the first electrically insulating layer;
   forming a second electrically insulating layer having third and fourth electrical interconnects therein, on the second test element;
   forming third and fourth test pads on the second electrically insulating layer, said third and fourth test pads electrically connected to the second test element by the first and second electrical interconnects, respectively; and
   testing operation of the second test element by contacting a pair of test probes to the third and fourth test pads.

8. The method of claim 7, wherein the first electrical interconnect comprises a first fuse therein; and wherein said testing operation of the second test element is preceded by blowing the first fuse.

9. The method of claim 7, wherein the third and fourth test pads are vertically aligned with the first and second test pads, respectively.

10. A test method for a semiconductor device, the test method comprising:
    providing a semiconductor device including a first test element, a first pad electrically connected to the first test element, and a first fuse electrically connected to the first test element and the first pad;
    primarily testing the first test element using the first pad;
    electrically disconnecting the first pad from the first test element by cutting the first fuse by allowing current of a predetermined level or higher to flow in the first fuse;
    forming a second pad electrically connected to the first pad;
    forming a second test element electrically connected to the second pad; and
    secondarily testing the second test element using the second pad.

11. The test method of claim 10, wherein the primarily testing and the secondarily testing are performed on different layer levels using the first pad and the second pad, respectively.

12. The test method of claim 10, wherein the first pad and the second pad are overlapped with each other.

13. The test method of claim 10, wherein the first test element is positioned on a first layer level and the second test element is positioned on a second layer level higher than the first layer level.

14. The test method of claim 13, wherein the second test element is positioned on a layer level higher than the first pad.

15. The test method of claim 10, wherein the first pad is positioned on a third layer level and the second pad is positioned on a fourth layer level higher than the third layer level.

16. The test method of claim 10, wherein the first fuse is a silicide electromigration fuse or a metal electromigration fuse.

17. The test method of claim 16, wherein the silicide electromigration fuse is formed at an active layer level or a gate layer level.

18. The test method of claim 16, wherein the metal electromigration fuse is formed at a via layer level or a wire layer level.

19. The test method of claim 10, wherein the semiconductor device further comprises a current leakage measuring device connected to the first fuse, and the current leakage measuring device measures a level of current leaked through the cut first fuse.

* * * * *